US011462412B2

(12) United States Patent
Tsuji

(10) Patent No.: US 11,462,412 B2
(45) Date of Patent: Oct. 4, 2022

(54) ETCHING METHOD

(71) Applicant: TOKYO ELECTRON LIMITED, Tokyo (JP)

(72) Inventor: Akihiro Tsuji, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 444 days.

(21) Appl. No.: 16/733,957

(22) Filed: Jan. 3, 2020

(65) Prior Publication Data

US 2020/0144068 A1 May 7, 2020

Related U.S. Application Data

(63) Continuation of application No. 16/069,944, filed as application No. PCT/JP2017/018375 on May 16, 2017, now Pat. No. 10,553,442.

(30) Foreign Application Priority Data

May 20, 2016 (JP) .............................. JP2016-101744

(51) Int. Cl.
*H01L 21/00* (2006.01)
*H01L 21/3065* (2006.01)
(Continued)

(52) U.S. Cl.
CPC ...... *H01L 21/3065* (2013.01); *H01J 37/3244* (2013.01); *H01L 21/02274* (2013.01);
(Continued)

(58) Field of Classification Search
CPC ......... H01L 21/02274; H01L 21/31116; H01L 21/32135; H01L 21/67069; H01L 21/768; H01L 21/32137; H01L 21/3065; H01L 21/31144; H01L 21/32136; H01J 37/3244; H01J 37/3249; H01J 37/32431; H01J 2237/334; H01J 2237/3341; H01J 2237/32

See application file for complete search history.

(56) References Cited

U.S. PATENT DOCUMENTS

| 7,708,859 B2 | 5/2010 | Huang et al. |
| 2015/0162168 A1 | 6/2015 | Oehrlein et al. |

FOREIGN PATENT DOCUMENTS

| JP | 61-258433 A | 11/1986 |
| JP | 10-303187 A | 11/1998 |

(Continued)

OTHER PUBLICATIONS

D. Metzler et al., J. Vac. Sci. Technol. A, vol. 34, pp. 01B101 to 01B101-10. (Year: 2016).

(Continued)

*Primary Examiner* — Nikolay K Yushin
(74) *Attorney, Agent, or Firm* — Weihrouch IP

(57) ABSTRACT

The present disclosure relates to an etching method including: a first step of forming an etching assistance layer on a surface of at least one of a plurality of silicon-containing regions by plasma of a processing gas generated in a processing container; and a second step of imparting energy to the etching assistance layer. The energy is equal to or greater than energy at which the etching assistance layer is removed, and smaller than energy at which a region located immediately below the etching assistance layer is sputtered, and a sequence including the first step and the second step is executed repeatedly.

17 Claims, 7 Drawing Sheets

(51) Int. Cl.

| | |
|---|---|
| *H01L 21/768* | (2006.01) |
| *H01L 21/311* | (2006.01) |
| *H01L 21/3213* | (2006.01) |
| *H01L 21/02* | (2006.01) |
| *H01L 21/67* | (2006.01) |
| *H01J 37/32* | (2006.01) |

(52) U.S. Cl.
CPC .. *H01L 21/31116* (2013.01); *H01L 21/31144* (2013.01); *H01L 21/32135* (2013.01); *H01L 21/32136* (2013.01); *H01L 21/32137* (2013.01); *H01L 21/67069* (2013.01); *H01L 21/768* (2013.01); *H01J 2237/334* (2013.01)

(56) References Cited

FOREIGN PATENT DOCUMENTS

| | | |
|---|---|---|
| JP | 11-260798 A | 9/1999 |
| JP | 2000-307001 A | 11/2000 |
| JP | 2001-521283 A | 11/2001 |
| JP | 2002-319574 A | 10/2002 |
| JP | 2006-24730 A | 1/2006 |
| JP | 2012-114463 A | 6/2012 |
| JP | 2014-532988 A | 12/2014 |
| JP | 2016-27594 A | 2/2016 |
| KR | 10-2015-0100522 A | 9/2015 |
| KR | 10-2015-0128582 A | 11/2015 |
| KR | 10-2016-0003565 A | 1/2016 |

OTHER PUBLICATIONS

International Search Report dated Jul. 4, 2017 in PCT/JP2017/018375.

ETCHING METHOD

CROSS REFERENCE TO RELATED APPLICATIONS

This application is a continuation application of U.S. Ser. No. 16/069,944, filed on Jul. 13, 2018, which is a U.S. national stage application of International Application No. PCT/JP2017/018375, filed on May 16, 2017, claiming priority from Japanese Patent Application No. 2016-101744, filed on May 20, 2016, all of which are incorporated herein by reference and priority is claimed to each of the foregoing.

TECHNICAL FIELD

Exemplary embodiments described herein relate to an etching method, and particularly, to a method of selectively etching one or more of a plurality of workpieces by a plasma processing for the plurality of workpieces.

BACKGROUND

In the manufacture of an electronic device, a processing of forming an opening such as a hole or a trench may be performed in a region made of silicon oxide ($SiO_2$) in some cases. In such a processing, a workpiece is generally exposed to plasma of a fluorocarbon gas so that the exposed region is etched, as described in Patent Document 1.

A technology for selectively etching a first region made of silicon oxide with respect to a second region made of silicon nitride has been known. As an example of such a technology, a self-aligned contact (SAC) technology has been known. The SAC technology is described in Patent Document 2.

A workpiece, which is a processing target of the SAC technology, includes a first region made of silicon oxide, a second region made of silicon nitride, and a mask. The second region is provided so as to define a recess, the first region is provided to fill the recess and cover the second region, and the mask is provided on the first region and provides an opening above the recess.

In the SAC technology in the related art, plasma of a processing gas containing a fluorocarbon gas, oxygen gas, and a rare gas is used to etch the first region, as described in Patent Document 2. By exposing the workpiece to the plasma of the processing gas, the first region is etched at the portion exposed from the opening of the mask so as to form an upper opening. In addition, since the workpiece is exposed to the plasma of the processing gas, a portion surrounded by the second region, that is, the first region in the recess, is etched in a self-aligning manner.

Thus, a lower opening continuous to the upper opening is formed in a self-aligning manner. In addition, when a deposit from the carbon-containing plasma gas included in the plasma gas is formed around the opening, the opening end face is protected, so that only the inside of the opening may be selectively etched.

In addition, as related technologies, a method of etching $SiO_2$ using CHF-based gas plasma (Patent Document 3), a method of selectively etching silicon nitride using fluorohydrocarbon ($CH_3F$, $CH_2F_2$), $O_2$, and carbon gas ($CO_2$) (Patent Document 4 and Patent Document 5), a method of forming a contact hole using fluorocarbon (Patent Document 6), a method of etching SiC using $CH_2F_2$ or $CH_3F$ (Patent Document 7), and the like have been known.

PRIOR ART DOCUMENT

Patent Document

Patent Document 1: U.S. Pat. No. 7,708,859
Patent Document 2: Japanese Patent Laid-Open Publication No. 2000-307001
Patent Document 3: Japanese National Publication of International Patent Application No. 2001-521283
Patent Document 4: Japanese Patent Laid-Open Publication No. 11-260798
Patent Document 5: Japanese Patent Laid-Open Publication No. 10-303187
Patent Document 6: Japanese Patent Laid-Open Publication No. 2002-319574
Patent Document 7: Japanese Patent Laid-Open Publication No. 2012-114463

DISCLOSURE OF THE INVENTION

Problems to be Solved

However, when a pattern is formed by plasma etching, there arises a problem in that etching of a pattern recess may not be performed as the scale of micronization becomes smaller. That is, the problem is that, when a deposit originating from the plasma gas is formed on an end face of an opening or an inner wall of a recess in order to protect the opening end of the recess, the opening is blocked due to the thickness of the deposit originating from the plasma gas and the inside of the opening may not be etched.

Therefore, there is a demand for a selective etching technology capable of forming a recess by etching even in the case of further micronization.

Means to Solve the Problems

A first etching method according to an aspect of the present disclosure is a method of selectively etching at least one of a plurality of silicon-containing regions having different compositions of a workpiece by accommodating the workpiece in a processing container. The method includes: a first step of forming an etching assistance layer on a surface of at least one of the plurality of silicon-containing regions by plasma of the processing gas generated in the processing container; and a second step of imparting energy to the etching assistance layer. The energy is equal to or greater than energy at which the etching assistance layer is removed, and smaller than energy at which a region located immediately below the etching assistance layer is sputtered, and a sequence including the first and second steps described above is executed repeatedly.

In the etching method, an etching assistance layer is formed in the first step and an appropriate energy is imparted to the etching assistance layer to remove the etching assistance layer in the second step. These steps are repeated. The thickness and the removed amount of the etching assistance layer are different depending on the composition of the silicon-containing region, so that the desired silicon-containing region may be selectively etched. This method is not a method of positively forming a deposit originating from the plasma gas on the opening end face of the recess to protect the opening when the recess is formed by etching. Thus, it is possible to selectively etch the silicon-containing region in the opening even when the required opening width is reduced.

In a second etching method, the etching assistance layer is a modified layer formed by modifying the surface of the at least one the silicon-containing region or a deposition layer in which an extremely thin deposit is deposited on the surface of the silicon-containing region. When the processing gas turned into plasma comes into contact with the silicon-containing region, the silicon-containing region is modified (degenerated) or an extremely thin deposit is formed thereon. When an extremely thin deposit is formed, the thickness thereof is controlled to range from about 0.1 nm to 1 nm.

In a third etching method, each of the above-described silicon-containing regions includes one selected from a group consisting of SiC, SiOC, SiOCN, SiON, $Si_3N_4$, SiCN, and $SiO_2$. Since the etching amounts of the silicon-containing regions differ markedly according to the steps described above, it is possible to reliably select and etch the desired silicon-containing region.

In a fourth etching method, the above-described processing gas is a gas capable of forming the etching assistance layer by bonding with the surface atoms of the silicon-containing region described above, and the processing gas includes at least one gas selected from a group consisting of a carbon-containing gas, an oxygen-containing gas, a nitrogen-containing gas, a halogen-containing gas, and a hydrogen-containing gas.

That is, various gases may bond with the surface layer atom of the silicon-containing region to form an etching assistance layer. Specifically, a carbon-containing gas, an oxygen-containing gas, a nitrogen-containing gas, a halogen-containing gas, or a hydrogen-containing gas may be bonded to a silicon atom.

In a fifth etching method, the carbon-containing gas is a hydrofluorocarbon gas or a fluorocarbon gas, the oxygen-containing gas is $O_2$, CO, or $CO_2$, the nitrogen-containing gas is $NH_3$ or $NF_3$, the halogen-containing gas is $NF_3$, $C_xH_yF_z$, or $C_xF_y$ (x, y, and z are natural numbers), and the hydrogen-containing gas is $C_xH_yF_z$ (x, y, and z are natural numbers).

These gases may bond with silicon atoms to form the modified layer or the deposition layer described above.

In a sixth etching method, the above-described processing gas includes $NH_3$ or $CHF_3$. In the case of these gases, it was confirmed that an etching assistance layer is formed by bonding with the surface layer atom of the silicon-containing region, and the effect of the selective etching property is large when the processing gas includes $NH_3$ or $CHF_3$.

Effect of the Invention

As described above, according to the etching method of the present disclosure, it is possible to perform a selective etching so that recesses may be formed by etching even when micronization progresses.

DETAILED DESCRIPTION TO EXECUTE THE INVENTION

Figure 1:
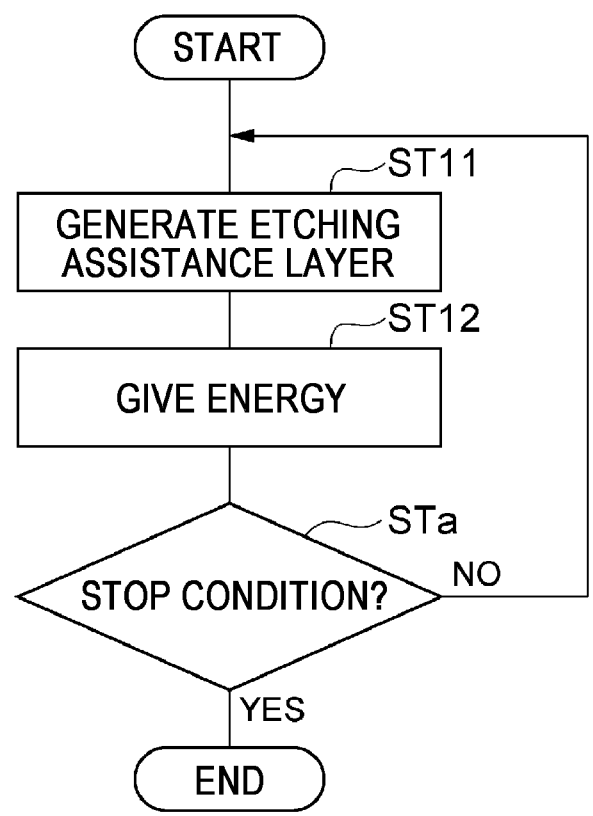
FIG. 1 is a flow chart illustrating an etching method according to an exemplary embodiment.

Hereinafter, various exemplary embodiments will be described in detail with reference to the accompanying drawings. Further, the same or corresponding elements in the drawings will be given the same reference numerals.

FIG. 1 is a flow chart illustrating an etching method according to an exemplary embodiment. The method MT illustrated in FIG. 1 is a method of selectively etching at least one of a plurality of regions by a plasma processing for a workpiece including the plurality of regions.

Figure 2:
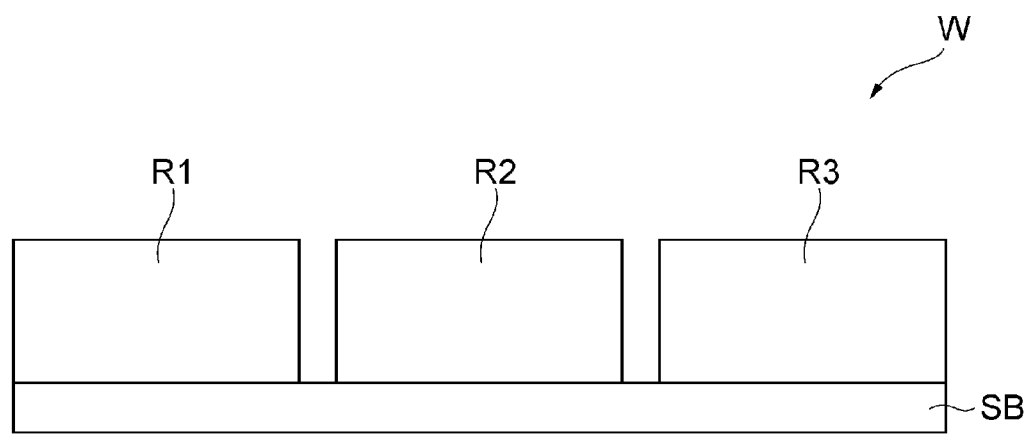
FIG. 2 is a cross-sectional view illustrating a workpiece to which the etching method according to the exemplary embodiment is applied.

FIG. 2 is a cross-sectional view illustrating a workpiece to which the etching method according to the exemplary embodiment is applied. FIG. 2 illustrates a wafer W in which three silicon-containing regions (a first region R1, a second region R2, and a third region R3) are provided on a substrate SB.

As an example, the first region R1 is made of silicon oxide ($SiO_2$), the second region R2 is made of silicon nitride ($Si_3N_4$), and the third region R3 is made of silicon carbide (SiC).

Figure 3:
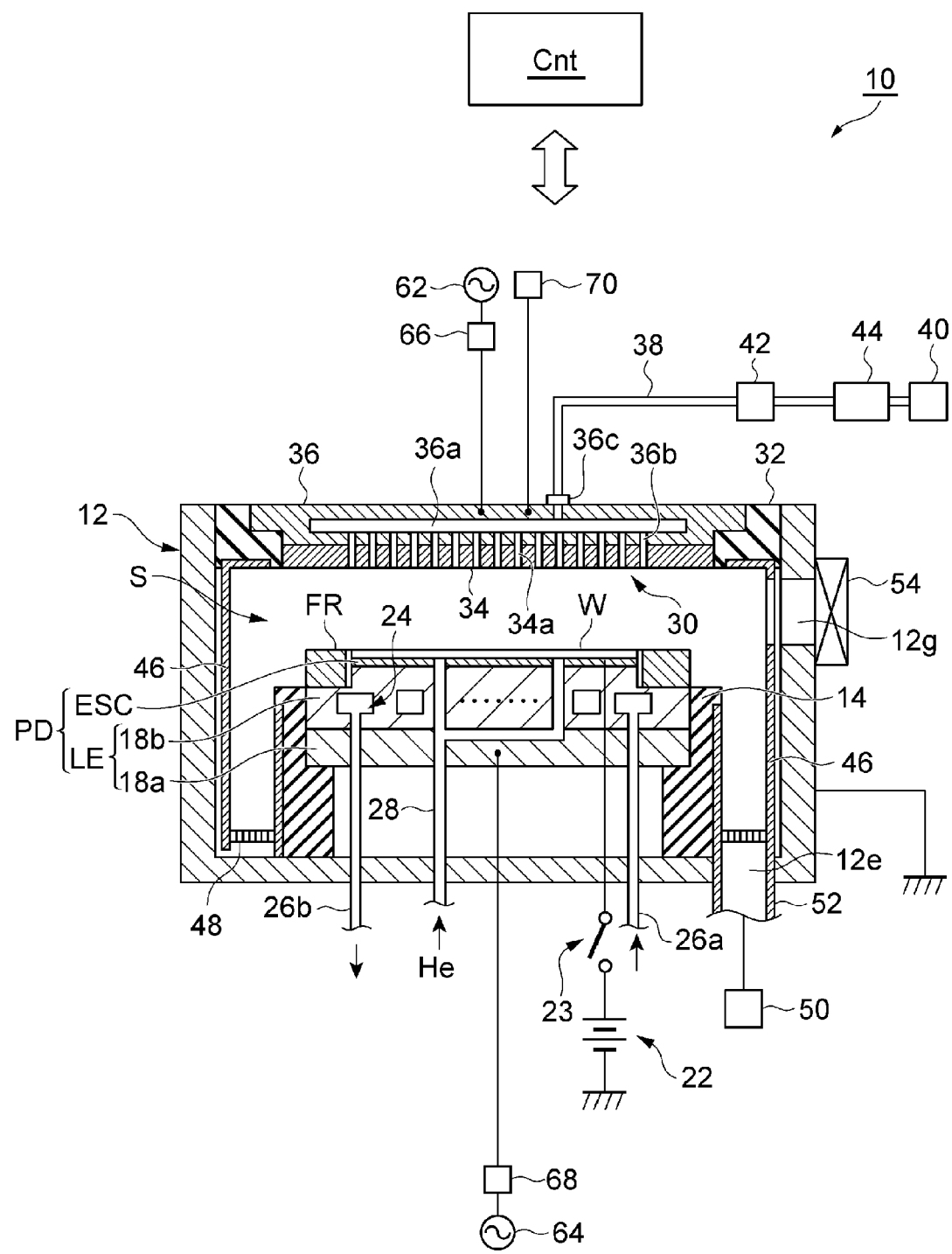
FIG. 3 is a view schematically illustrating an example of a plasma processing apparatus that may be used to implement the method illustrated in FIG. 1.

In the method MT, each region on a wafer W, which is a workpiece illustrated in FIG. 2, is processed in a plasma processing apparatus. FIG. 3 is a view schematically illustrating an example of a plasma processing apparatus that may be used to implement the method illustrated in FIG. 1. The plasma processing apparatus 10 illustrated in FIG. 3 is a capacitively coupled plasma etching apparatus, and includes a substantially cylindrical processing container 12. The inner wall surface of the processing container 12 is made of, for example, an anodized aluminum. The processing container 12 is securely grounded.

A support 14 having a substantially cylindrical shape is provided on a bottom portion of the processing container 12. The support 14 is made of, for example, an insulating material. The support 14 extends in the vertical direction from the bottom portion of the processing container 12 in the processing container 12. In addition, a pedestal PD is provided in the processing container 12. The pedestal PD is supported by the support 14.

The pedestal PD holds the above-described substrate SB (wafer W) on an upper surface thereof. The pedestal PD has a lower electrode LE and an electrostatic chuck ESC. The lower electrode LE includes a first plate 18a and a second plate 18b. The first plate 18a and the second plate 18b are made of metal such as aluminum and have a substantially disk shape. The second plate 18b is provided on the first plate 18a and is electrically connected to the first plate 18a.

An electrostatic chuck ESC is provided on the second plate 18b. The electrostatic chuck ESC has a structure in which an electrode serving as a conductive film is disposed between a pair of insulating layers or insulating sheets. The electrode of the electrostatic chuck ESC is electrically connected to a direct current power source 22 via a switch 23. The electrostatic chuck ESC attracts the wafer W by the electrostatic force such as a coulomb force generated by the direct current voltage from the direct current power source 22. Thus, the electrostatic chuck ESC may hold the wafer W.

A focus ring FR is arranged to surround the edge of the wafer W and the electrostatic chuck ESC on the peripheral portion of the second plate 18b. The focus ring FR is provided to improve the uniformity of the etching. The focus ring FR is made of materials suitably selected depending on the material of a film to be etched, and may be made of, for example, quartz.

A coolant flow path 24 is provided inside the second plate 18b. The coolant flow path 24 constitutes a temperature control mechanism. A coolant is supplied to the coolant flow path 24 from a chiller unit provided outside the processing container 12 via a pipe 26a. The coolant supplied to the coolant flow path 24 is returned to the chiller unit via the pipe 26b. In this manner, the coolant is circulated between the coolant flow path 24 and the chiller unit. By controlling the temperature of the coolant, the temperature of the wafer W supported by the electrostatic chuck ESC is controlled.

In addition, the plasma processing apparatus 10 is provided with a gas supply line 28. The gas supply line 28 supplies a heat transfer gas from a heat transfer gas supply mechanism, for example, He gas, between the upper surface of the electrostatic chuck ESC and the back surface of the wafer W.

In addition, the plasma processing apparatus 10 includes an upper electrode 30. The upper electrode 30 is disposed above the pedestal PD to face the pedestal PD. The lower electrode LE and the upper electrode 30 are provided substantially parallel to each other. A processing space S is provided to perform a plasma processing on the wafer W between the upper electrode 30 and the lower electrode LE.

The upper electrode 30 is supported on the upper portion of the processing container 12 via an insulating shielding member 32. In an exemplary embodiment, the upper electrode 30 may be configured such that the distance in the vertical direction from the top surface of the pedestal PD, that is, the placement surface of the wafer, is variable. The upper electrode 30 may include an electrode plate 34 and an electrode support 36. The electrode plate 34 faces the processing space S, and the electrode plate 34 is provided with a plurality of gas ejection holes 34a. In the exemplary embodiment, the electrode plate 34 is made of silicon.

The electrode support 36 supports the electrode plate 34 in a freely detachable manner, and may be made of a conductive material such as aluminum. The electrode support 36 may have a water-cooled structure. A gas diffusion chamber 36a is provided in the electrode support 36. From the gas diffusion chamber 36a, a plurality of gas flow holes 36b communicating with the gas ejection holes 34a extend downward. A gas introduction port 36c for introducing a processing gas into the gas diffusion chamber 36a is formed in the electrode support 36. A gas supply pipe 38 is connected to the gas introduction port 36c.

The gas supply line 38 is connected to a gas source group 40 via a valve group 42 and a flow controller group 44. The gas source group 40 includes a plurality of gas sources. As an example, the gas source group 40 includes one or more fluorocarbon gas sources, a rare gas source, a nitrogen gas ($N_2$ gas) source, a hydrogen gas ($H_2$ gas) source, and an oxygen-containing gas source. The one or more fluorocarbon gas sources may include, for example, a $C_4F_8$ gas source, a $CF_4$ gas source, and a $C_4F_6$ gas source. The rare gas source may be a source of any rare gas such as He gas, Ne gas, Ar gas, Kr gas, or Xe gas, and is an Ar gas source in an example. In addition, the oxygen-containing gas source may be, for example, an oxygen gas ($O_2$ gas) source. The oxygen-containing gas may be any gas containing oxygen, for example, a carbon dioxide gas such as CO gas or $CO_2$ gas. In this example, the necessary gas is selected and used from a group consisting of a carbon-containing gas, an oxygen-containing gas, a nitrogen-containing gas, a halogen-containing gas, and a hydrogen-containing gas included in the gas source group 40. The carbon-containing gas may be a hydrofluorocarbon gas or a fluorocarbon gas, the oxygen-containing gas may be $O_2$, CO, or $CO_2$, the nitrogen-containing gas may be $NH_3$ or $NF_3$, and the halogen-containing gas may be $NF_3$, $C_xH_yF_z$, or $C_xF_y$ (x, y, and z are natural numbers), and the hydrogen-containing gas may be $C_xH_yF_z$ (x, y, and z are natural numbers).

The valve group 42 includes a plurality of valves, and the flow controller group 44 includes a plurality of flow controllers such as a mass flow controller. The plurality of gas sources of the gas source group 40 are connected to the gas supply pipe 38 via the corresponding valve of the valve group 42 and the corresponding flow controller of the flow controller group 44, respectively.

In the plasma processing apparatus 10, a deposit shield 46 is provided so as to be detachable along the inner wall of the processing container 12. The deposit shield 46 is also provided on the outer periphery of the support 14. The deposit shield 46 suppresses an etching by-product (deposit) from being attached to the processing container 12 and may be constituted by coating an aluminum material with ceramics such as $Y_2O_3$.

An exhaust plate 48 is provided on the bottom portion of the processing container 12 and between the support 14 and the side wall of the processing container 12. The exhaust plate 48 may be constituted, for example, by coating an aluminum material with ceramics such as $Y_2O_3$. An exhaust port 12e is provided below the exhaust plate 48 in the processing container 12. An exhaust device 50 is connected to the exhaust port 12e via an exhaust pipe 52. The exhaust device 50 has a vacuum pump such as a turbo molecular pump so that the space in the processing container 12 may be reduced to a desired degree of vacuum. Further, a carry-in/carry-out port 12g of the wafer W is provided on the side wall of the processing container 12, and the carry-in/carry-out port 12g may be opened and closed by a gate valve 54.

The plasma processing apparatus 10 further includes a first high-frequency power source 62 and a second high-frequency power source 64. The first high-frequency power source 62 is a power source that generates a high-frequency power for generating plasma, and generates, for example, a high-frequency power having a frequency of 40 to 100 MHz. The first high-frequency power source 62 is connected to the upper electrode 30 via a matching device 66. The matching device 66 is a circuit that matches an output impedance of the first high-frequency power source 62 with an input impedance of a load side (upper electrode 30 side). The first high-frequency power source 62 may be connected to the lower electrode LE via the matching device 66.

The second high-frequency power source 64 is a power source that generates a high-frequency bias power for drawing ions into the wafer W, and generates, for example, a high-frequency bias power having a frequency within the range of 400 kHz to 40 MHz. The second high-frequency power source 64 is connected to the lower electrode LE via a matching device 68. The matching device 68 is a circuit that matches an output impedance of the second high-frequency power source 64 with an input impedance of a load side (lower electrode LE side).

In addition, the plasma processing apparatus 10 further includes a power source 70. The power source 70 is connected to the upper electrode 30. The power source 70 applies a voltage to the upper electrode 30 to draw the positive ions present in the processing space S into the electrode plate 34. In an example, the power source 70 is a direct current power source that generates a negative direct current voltage. In another example, the power source 70 may be an alternating current power source that generates an alternating current voltage of a relatively low-frequency. The voltage applied from the power source 70 to the upper electrode may be −150 V or less. In other words, the voltage applied to the upper electrode 30 by the power source 70 may be a negative voltage having an absolute value of 150 or more. When such a voltage is applied from the power source 70 to the upper electrode 30, the positive ions present in the processing space S collide with the electrode plate 34. As a result, secondary electrons and/or silicon are released from the electrode plate 34. The released silicon combines with the active species of the fluorine present in the processing space S and reduce the amounts of active species of fluorine.

In addition, in an exemplary embodiment, the plasma processing apparatus 10 may further include a controller Cnt. The controller Cnt is a computer including a processor, a storage unit, an input device, a display device, and the like, and controls the respective portions of the plasma processing device 10. In the controller Cnt, an operator may operate input of commands to manage the plasma processing apparatus 10 using an input device, and visualize and display an operation state of the plasma processing apparatus 10 by a display device. In addition, the storage unit of the controller Cnt stores a control program that causes the processor to control various processes executed by the plasma processing apparatus 10, and a program that causes the respective portions of the plasma processing apparatus 10 to execute processes according to processing conditions. That is, a processing recipe is stored.

Hereinafter, the method MT will be described in detail based on examples. In the following examples, the wafer W illustrated in FIG. 2 is carried into the plasma processing apparatus 10 illustrated in FIG. 3, and the wafer W is placed on the pedestal PD to be held by the pedestal PD. In the examples, three regions are provided on one wafer W. The first region R1 is made of silicon oxide ($SiO_2$), the second region R2 is made of silicon nitride ($Si_3N_4$), and the third region R3 is made of silicon carbide (SiC).

FIRST EXAMPLE

In a first example, after a wafer W is held by a pedestal PD, a first step ST11 is executed. In the first step ST11, the plasma of a processing gas containing a halogen-containing gas and the plasma of a processing gas containing an inert gas are generated in a processing container 12 accommodating the wafer W. Therefore, in the first step ST11, the processing gas is supplied into the processing container 12 from the gas source selected among a plurality of gas sources of the gas source group 40. The processing gas uses a $CHF_3$ gas as a halogen-containing gas and an Ar gas as an inert gas. In the first step ST11, an exhaust device 50 is operated so that a pressure in the processing container 12 is set to a predetermined pressure. Further, in the first step ST11, a high-frequency power from a first high-frequency power source 62 is supplied to a lower electrode LE. The operation of each portion of the plasma processing apparatus 10 described above in the step ST11 may be controlled by the controller Cnt.

Figure 4:
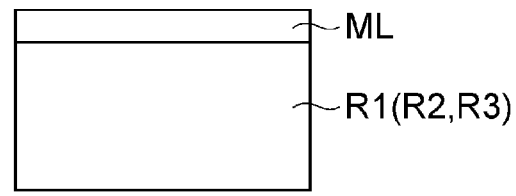
FIG. 4 is a cross-sectional view of the workpiece in which step ST11 is executed.

Hereinafter, various conditions in the step ST11 are exemplified.
Pressure in processing container: 10 mTorr to 50 mTorr (1.33 Pa to 6.67 Pa)
Processing gas
  Flow rate of $CHF_3$ gas: 1 sccm to 50 sccm
  Flow rate of Ar gas: 200 sccm to 1500 sccm
High-frequency power of the first high-frequency power source 62: 60 MHz, 50 W to 500 W
High-frequency bias power of the second high-frequency power source 64: 40 MHz, 0 W to 50 W FIG. 4 is a cross-sectional view of the region in which the first step ST11 is executed. An etching assistance layer ML is formed on any of the three regions. The etching assistance layer ML is a modified layer that is formed by exposing the region by the plasma of a processing gas containing a halogen-containing gas and the plasma of a processing gas containing an inert gas, and as a result, modifying the silicon-containing region, but may be considered as a very thin deposition layer. The execution time length of the first step ST11 is 5 seconds.

In the method MT of the first example, a second step ST12 is executed subsequently. In the second step ST12, energy is imparted to the etching assistance layer ML which is greater than the amount by which the etching assistance layer ML is removed, and which is lower than the sputtering amount of the region immediately below the etching assistance layer ML. In the second step ST12, the plasma of the processing gas containing the inert gas is generated in the processing container 12 accommodating the wafer W. The processing gas is supplied into the processing container 12 from the gas source selected among a plurality of gas sources of the gas source group 40. Ar gas is used as an inert gas.

In the second step ST12, the exhaust device 50 is operated so that a pressure in the processing container 12 is set to a predetermined pressure. Further, in the step ST12, a high-frequency power from the first high-frequency power source 62 is supplied to the lower electrode LE. In the step ST12, a high-frequency bias power from the second high-frequency power source 64 is supplied to the lower electrode LE. The operation of each portion of the plasma processing apparatus 10 described above in the step ST12 may be controlled by the controller Cnt.

Hereinafter, various conditions in the step ST12 are exemplified.
Pressure in processing container: 10 mTorr to 50 mTorr (1.33 Pa to 6.67 Pa)
Processing gas
  Flow rate of Ar gas: 100 sccm to 1500 sccm
High-frequency power of the first high-frequency power source 62: 60 MHz, 50 W to 500 W
High-frequency bias power of the second high-frequency power source 64: 40 MHz, 0 W to 50 W A sequence including the first step ST11 and the second step ST12 is repeated 50 times until a stop condition STa is satisfied.

Figure 5:
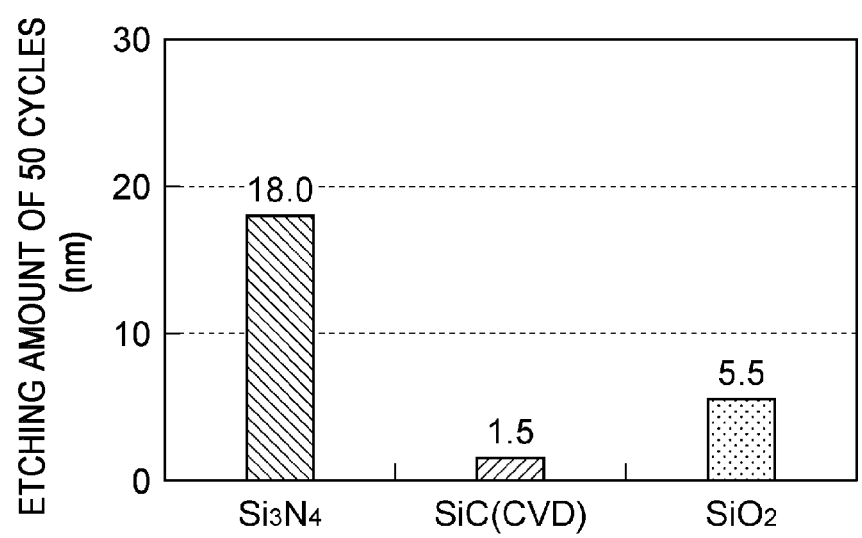
FIG. 5 is a graph illustrating the etching amount of each workpiece according to a first example.

FIG. 5 is a graph illustrating an etching amount (nm) at 50 cycles of each region in the first example. The horizontal axis represents the type of each silicon-containing film formed in the first region. The sequence of the first step and the second step is assumed to be one cycle. The amount of surface scraping depends on the type of region. Silicon carbide ($Si_3N_4$) in the second region R2 represents the maximum value, and silicon carbide (SiC) in the third region R3 represents the minimum value. SiC in the third region R3 is silicon carbide formed by a chemical vapor deposition (CVD) method.

The pressure in the processing container, the flow rate of $CHF_3$ gas, the flow rate of Ar gas, the power of the first high-frequency power source, and the second high-frequency power source in the first step S11 used to obtain this data are 25 sccm, 1000 sccm, 100 W, and 0 W in the above-described numerical ranges, the flow rate of Ar gas, the power of the first high-frequency power source, and the second high-frequency power source in the second step ST12 are 1000 sccm, 100 W, and 10 W in the above-described numerical ranges, and the range of the various conditions represents a range in which the same effect may be obtained even when these parameters are changed.

In the first example, the rate at which the surface is scraped tends to decrease as the exposure time to the plasma increases. This result indicates that the surface area has the etching assistance layer ML and the rate at which the etching assistance layer is scraped is greater than the rate at which the unmodified region is scraped.

SECOND EXAMPLE

In a second example, after a wafer W is held by a pedestal PD, a first step ST11 is executed. In the first step ST11, the plasma of a processing gas containing a halogen-containing gas and the plasma of a processing gas containing an oxygen-containing gas and an inert gas are generated in a processing container 12 accommodating the wafer W. $CHF_3$ gas is used as the halogen-containing gas and oxygen gas is used as the oxygen-containing gas. Ar gas is used as the inert gas. In the first step ST11, a high-frequency power from the first high-frequency power source 62 is supplied to the lower electrode LE.

Hereinafter, various conditions in the step ST11 are exemplified.

Pressure in processing container: 10 mTorr to 50 mTorr (1.33 Pa to 6.67 Pa)
Processing gas
Flow rate of $CHF_3$ gas: 1 sccm to 50 sccm
Flow rate of Ar gas: 200 sccm to 1500 sccm
Flow rate of oxygen gas: 0 sccm to 20 sccm
High-frequency power of the first high-frequency power source 62: 60 MHz, 50 W to 500 W
High-frequency bias power of the second high-frequency power source 64: 40 MHz, 0 W to 50 W In the second example, the execution time length of the first step ST11 is 5 seconds.

In the second example, a second step ST12 is executed subsequently. Ar gas is used as the inert gas. In the step ST12, the exhaust device 50 is operated so that a pressure in the processing container 12 is set to a predetermined pressure. Further, in the second step ST12, a high-frequency power from the first high-frequency power source 62 is supplied to the lower electrode LE. In the second step ST12, a high-frequency bias power from the second high-frequency power source 64 is supplied to the lower electrode LE.

Hereinafter, various conditions in the second step ST12 are exemplified. Pressure in processing container: 10 mTorr to 50 mTorr (1.33 Pa to 6.67 Pa)
Processing gas
Flow rate of Ar gas: 200 sccm to 1500 sccm
High-frequency power of the first high-frequency power source 62: 60 MHz, 50 W to 500 W
High-frequency bias power of the second high-frequency power source 64: 40 MHz, 0 W to 50 W A sequence including the first step ST11 and the second step ST12 is repeated 50 times until a stop condition STa is satisfied.

Figure 6:
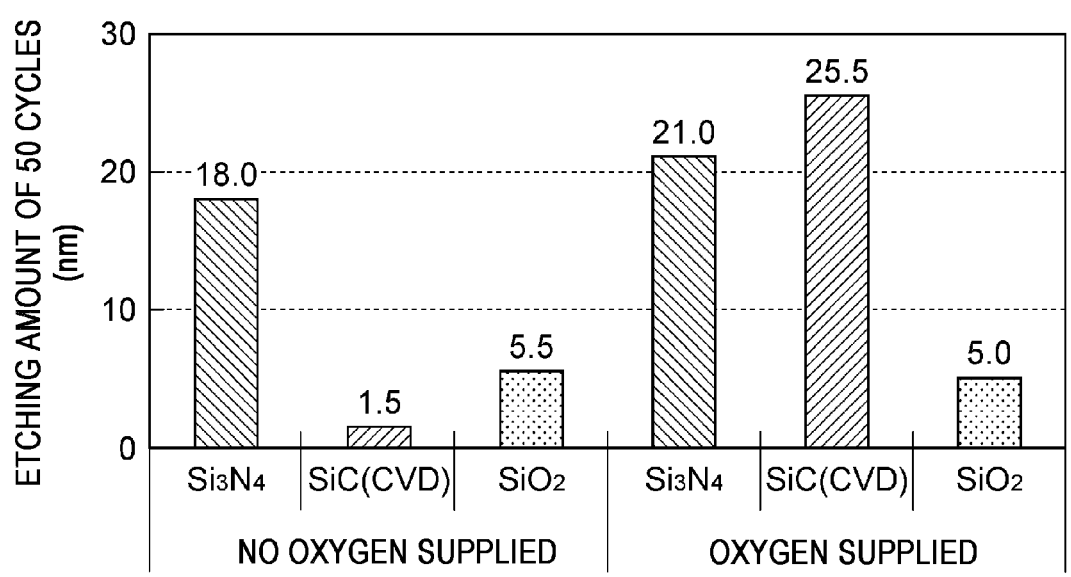
FIG. 6 is a graph illustrating the etching amount of each workpiece according to a second example.

FIG. 6 is a graph illustrating an etching amount (nm) at 50 cycles of each region in the second example. In the second example, the case where oxygen gas ($O_2$) is introduced in addition to Ar gas is verified.

FIG. 6 illustrates the etching amount (nm) when the flow rate of oxygen gas is 0 sccm (no oxygen supplied) and the etching amount (nm) when the flow rate of oxygen gas is 2 sccm (oxygen supplied). The amount of surface scraping depends on the type of region. Silicon carbide ($Si_3N_4$) in the second region R2 represents the maximum value, and silicon carbide (SiC) in the third region R3 represents the minimum value. When the flow rate of oxygen gas is 2 sccm, silicon carbide (SiC) in the third region R3 represents the maximum value of the amount of surface scraping, and oxide silicon ($SiO_2$) in the first region R1 represents the minimum value of the amount of surface scraping.

The pressure in the processing container, the flow rate of $CHF_3$ gas, the flow rate of Ar gas, the flow rate of oxygen gas, and the power of the first high-frequency power source, and the power of second high-frequency power source in the first step S11 used to obtain this data are 25 sccm, 1000 sccm, 100 W, and 0 W in the above-described numerical ranges, the flow rate of Ar gas and the power of the first high-frequency power source, and the power of the second high-frequency power source in the second step ST12 are 1000 sccm, 100 W, and 10 W in the above-described numerical ranges, and the range of the various conditions represents a range in which the same effect may be obtained even when these parameters are changed.

THIRD EXAMPLE

In a third example, after a wafer W is held by a pedestal PD, a first step ST11 is executed. In the first step ST11, the plasma of a processing gas containing a halogen-containing gas and the plasma of a processing gas containing an inert gas are generated in a processing container 12 accommodating the wafer W. A $NF_3$ gas is used as the halogen-containing gas and an Ar gas is used as the inert gas. In the first step ST11, a high-frequency power from the first high-frequency power source 62 is supplied to the lower electrode LE. The operation of each portion of the plasma processing apparatus 10 described above in the first step ST11 may be controlled by the controller Cnt.

Hereinafter, various conditions in the first step ST11 are exemplified.

Pressure in processing container: 10 mTorr to 200 mTorr (1.33 Pa to 26.67 Pa)
Processing gas
Flow rate of $NF_3$ gas: 1 sccm to 200 sccm
Flow rate of Ar gas: 0 sccm to 1500 sccm
High-frequency power of the first high-frequency power source 62: 60 MHz, 50 W to 500 W
High-frequency bias power of the second high-frequency power source 64: 40 MHz, 0 W to 50 W In the third example, the execution time length of the step ST11 is 5 seconds.

In the third example, a second step ST12 is executed subsequently. An Ar gas is used as an inert gas. In the second step ST12, a high-frequency power from the first high-frequency power source 62 is supplied to the lower electrode LE. In the second step ST12, a high-frequency bias power from the second high-frequency power source 64 is supplied to the lower electrode LE.

Hereinafter, various conditions in the second step ST12 are exemplified.

Pressure in processing container: 10 mTorr to 50 mTorr (1.33 Pa to 6.67 Pa)

Processing gas

Flow rate of Ar gas: 200 sccm to 1500 sccm

High-frequency power of the first high-frequency power source 62: 60 MHz, 50 W to 500 W High-frequency bias power of the second high-frequency power source 64: 40 MHz, 0 W to 50 W A sequence including the first step ST11 and the second step ST12 is repeated 50 times until a stop condition STa is satisfied.

Figure 7:
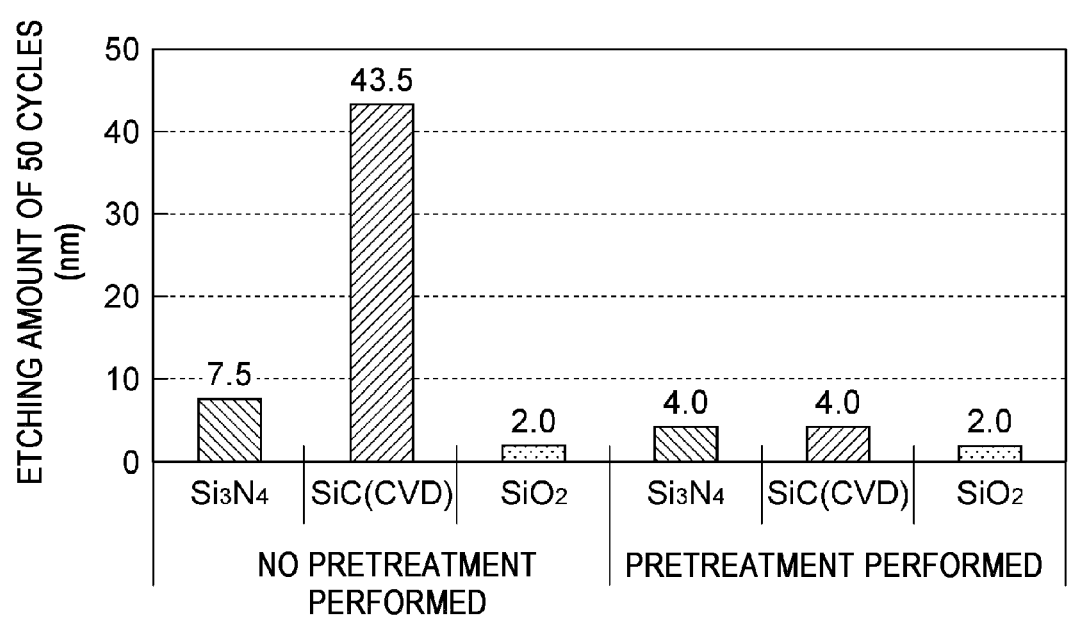
FIG. 7 is a graph illustrating the etching amount of each workpiece according to third and fourth examples.

FIG. 7 is a graph illustrating an etching amount (nm) at 50 cycles of each region in the third example. The horizontal axis represents the type of each silicon-containing film formed in the first region. The amount of surface scraping depends on the type of region. Silicon carbide (SiC) in the third region R3 represents the maximum value, and silicon oxide ($SiO_2$) in the first region R3 represents the minimum value.

The pressure in the processing container, the flow rate of $NF_3$ gas, the flow rate of Ar gas, and the power of the first and second high-frequency power sources in the first step S11 used to obtain this data are 6 sccm, 1000 sccm, 100 W, and 0 W in the above-described numerical ranges, the Ar gas flow rate and the power of the first and second high-frequency power sources in the second step ST12 are 1000 sccm, 100 W, and 10 W in the above-described numerical ranges, and the range of the various conditions represents a range in which the same effect may be obtained even when these parameters are changed.

FOURTH EXAMPLE

In a fourth example, after a wafer W is held by a pedestal PD, a pretreatment step is performed before a first step ST11 is executed. The plasma of a processing gas containing an oxygen-containing gas and the plasma of a processing gas containing an inert gas are generated in a processing container 12 accommodating the wafer W. An oxygen gas is used as the oxygen-containing gas, and an Ar gas is used as the inert gas. In the first step ST11, a high-frequency power from the first high-frequency power source 62 is supplied to the lower electrode LE. The operation of each portion of the plasma processing apparatus 10 described above in the first step ST11 may be controlled by the controller Cnt.

Hereinafter, various conditions in the first step ST11 are exemplified.

Pressure in processing container: 10 mTorr to 200 mTorr (1.33 Pa to 26.67 Pa)

Processing gas

Flow rate of oxygen gas: 1 sccm to 200 sccm

Flow rate of Ar gas: 0 sccm to 1500 sccm

High-frequency power of the first high-frequency power source 62: 60 MHz, 50 W to 500 W High-frequency bias power of the second high-frequency power source 64: 40 MHz, 0 W to 50 W In the fourth example, the execution time length of the pretreatment step in the first step ST11 is 3 seconds. In the fourth example, the first step ST11 is executed subsequently. In the first step ST11, the plasma of a processing gas containing a halogen-containing gas and the plasma of a processing gas containing an inert gas are generated in a processing container 12 accommodating the wafer W. A $NH_3$ gas is used as the halogen-containing gas, and an Ar gas is used as the inert gas. In the first step ST11, a high-frequency power from the first high-frequency power source 62 is supplied to the lower electrode LE. The operation of each portion of the plasma processing apparatus 10 described above in the first step ST11 may be controlled by the controller Cnt.

Hereinafter, various conditions in the first step ST11 are exemplified.

Pressure in processing container: 10 mTorr to 200 mTorr (1.33 Pa to 26.67 Pa)

Processing gas

Flow rate of $NF_3$ gas: 1 sccm to 200 sccm

Flow rate of Ar gas: 0 sccm to 1500 sccm

High-frequency power of the first high-frequency power source 62: 60 MHz, 50 W to 500 W High-frequency bias power of the second high-frequency power source 64: 40 MHz, 0 W to 50 W In the fourth example, the execution time length of the step ST11 is 5 seconds.

In the fourth example, the first step ST11 is executed subsequently. An Ar gas is used as an inert gas. In the step ST12, a high-frequency power from the first high-frequency power source 62 is supplied to the lower electrode LE. Further, in the step ST12, a high-frequency bias power from the second high-frequency power source 64 is supplied to the lower electrode LE.

Hereinafter, various conditions in the step ST12 are exemplified.

Pressure in processing container: 10 mTorr to 50 mTorr (1.33 Pa to 6.67 Pa)

Processing gas

Flow rate of Ar gas: 200 sccm to 1500 sccm

High-frequency power of the first high-frequency power source 62: 60 MHz, 50 W to 500 W High-frequency bias power of the second high-frequency power source 64: 40 MHz, 0 W to 50 W A sequence including the first step ST11 and the second step ST12 is repeated 50 times until a stop condition STa is satisfied.

In the fourth example, the etching amount (nm) at 50 cycles of each region is illustrated on the right side of FIG. 7.

The fourth example represents experimental results in which etching of the third example is suppressed by pretreatment. Thus, in the case of etching using the etching assistance layer of the surface layer, it is possible to turn on/off the etching depending on the surface condition.

The pressure in the processing container, the flow rate of oxygen gas, the flow rate of Ar gas, the power of the first high-frequency power source, and the power of the second high-frequency power source in the first step S11 used to obtain the data of the fourth example are 6 sccm, 1000 sccm, 100 W, and 0 W in the above-described numerical ranges, the flow rate of Ar gas, the power of the first high-frequency power source, and the power of the second high-frequency power source in the second step ST12 are 1000 sccm, 100 W, and 10 W in the above-described numerical ranges, and the range of the various conditions represents a range in which the same effect may be obtained even when these parameters are changed.

As described above, the etching method according to the above-described exemplary embodiment is a method of accommodating a workpiece including a plurality of silicon-containing regions (first region R1, second region R2, third region R3) having different compositions (wafer W) in a processing container and selectively etching one or more of the plurality of silicon-containing regions. The etching method includes: a first step ST11 of forming an etching assistance layer ML on one or more surfaces of the plurality of silicon-containing regions by plasma of a processing gas generated in the processing container; and a second step ST12 of imparting energy to the etching assistance layer ML. The energy EG is equal to or greater than the energy Ee from which the etching assistance layer ML is removed, a region located immediately below the etching assistance layer ML is smaller than a sputtering energy Es (Ee≤Eg<Es), and a sequence including the first step ST11 and the second step ST12 is repeatedly executed.

In the etching method, the etching assistance layer is formed in the first step and an appropriate energy is imparted to the etching assistance layer to remove the etching assistance layer in the second step. These steps are repeated. The thickness and the removed amount of the etching assistance layer are different depending on the composition of the silicon-containing region, so that the desired silicon-containing region may be selectively etched. This method is not a method of positively forming a deposit originating from plasma on the opening end face of a recess to protect the opening when the recess is formed by etching. Thus, it is possible to selectively etch the silicon-containing region in the opening even when the required opening width is reduced.

Further, the above-described etching assistance layer is a modified layer formed by modifying the surface of the silicon-containing region or a deposition layer formed by depositing an extremely thin deposit on the surface of the silicon-containing region. When the processing gas turned into plasma comes into contact with the silicon-containing region, the silicon-containing region is modified (degenerated) or an extremely thin deposit is formed thereon. When an extremely thin deposit is formed, the thickness thereof is controlled to be about 0.1 nm to 1 nm.

Each of the silicon-containing regions includes one selected from the group consisting of SiC, SiOC, SiOCN, SiON, $Si_3N_4$, SiCN, and $SiO_2$. Since the etching amounts of the silicon-containing regions differ markedly according to the steps described above, it is possible to reliably select and etch the desired silicon-containing region. In the above-described exemplary embodiment, SiC, $Si_3N_4$, and $SiO_2$ were verified. However, when Si is contained in the other materials, the etching assistance layer is formed. The etching speed is also different. Therefore, the same effect as in the above-described exemplary embodiment is exhibited.

In addition, the above-described processing gas is a gas capable of forming the etching assistance layer by bonding with the surface layer atom of the silicon-containing region, and the gas includes at least one gas selected from a group consisting of a carbon-containing gas, an oxygen-containing gas, a nitrogen-containing gas, a halogen-containing gas, and a hydrogen-containing gas.

That is, various gases may bond with the surface layer atom of the silicon-containing region to form an etching assistance layer. Specifically, a carbon-containing gas, an oxygen-containing gas, a nitrogen-containing gas, a halogen-containing gas, or a hydrogen-containing gas may bond with a silicon atom.

Here, the carbon-containing gas is a hydrofluorocarbon gas ($CH_3F$, $CH_2F_2$, $CHF_3$, or $C_xH_yF_z$ (x, y, and z are natural numbers)) or a fluorocarbon gas ($C_4F_8$ or $C_xF_y$ (x and y are natural numbers)), and the oxygen-containing gas is $O_2$, CO, COS, or $CO_2$, and the nitrogen-containing gas is $N_2$, $NH_3$, or $NF_3$, and the halogen-containing gas is $Cl_2$, HBr, $NF_3$, $C_xH_yF_z$, or $C_xF_y$ (x, y, and z are natural numbers), and the hydrogen-containing gas is $H_2$ or the like.

That is, specific examples of the above gases are described above. Since these gases may bond with silicon atoms and the modified layer or the deposition layer described above may be formed, the effect as that in the above-described exemplary embodiment is exhibited.

Specifically, the processing gas includes $NF_3$ or CHF. In the case of these gases, an etching assistance layer is formed by reliably reacting the silicon atoms on the surface of the silicon, and etching with excellent selectivity may be performed.

In the case of forming recesses, a silicon-containing region with a low etching speed may be disposed on both sides of the silicon-containing region having a high etching speed in the vertical cross-sectional structure. In this case, a region with a high etching speed may be selectively etched to form recesses.

DESCRIPTION OF SYMBOLS

10: plasma processing apparatus
12: processing container
30: upper electrode
PD: pedestal
LE: lower electrode
ESC: electrostatic chuck
40: gas source group
42: valve group
44: flow controller group
50: exhaust device
62: first high-frequency power source
64: second high-frequency power source
Cnt: controller
W: wafer
R1: first region
R2: second region
R3: third region
ML: etching assistance layer

What is claimed is:

1. An apparatus for etching a workpiece including a first region and a second region different from the first region, the first region including SiC or SiN and the second region including a Si-containing material, the apparatus comprising:
   a chamber;
   a substrate support disposed in the chamber;
   a gas inlet for introducing a process gas into the chamber;
   a plasma generator configured to generate a plasma from the process gas in the chamber; and
   a controller configured to cause:
   (a) forming an etching assistance layer on at least one of the first region and the second region, and
   (b) after (a), removing the etching assistance layer by etching the first region at a first etch rate and the second region at a second etch rate, the first etch rate being greater than the second etch rate.

2. The apparatus of claim 1, wherein the controller is further configured to cause repeating (a) and (b).

3. The apparatus of claim 1, wherein, in (b), the etching assistance layer is removed by imparting an energy at which a region located immediately below the etching assistance layer is not sputtered.

4. The apparatus of claim 1, wherein the first region of the workpiece has SiN and the second region has SiC.

5. The apparatus of claim 1, wherein the first region of the workpiece has SiC and the second region has SiN.

6. The apparatus of claim 1, wherein, in (b), plasma is generated from an inert gas and an oxygen-containing gas.

7. The apparatus of claim 1, further comprising a bias source connected to the support,
wherein, in (a), a bias power is not applied to the support, and, in (b), the bias power is applied to the support.

8. The apparatus of claim 1, wherein, in (b), a halogen plasma is generated from a halogen gas for the etching.

9. The apparatus of claim 8, wherein the halogen gas is $Cl_2$, HBr, $NF_3$, $C_xH_yF_z$, or $C_xF_y$ (x, y, and z are natural number).

10. The apparatus of claim 1, wherein the second region of the workpiece has $SiO_2$.

11. The apparatus of claim 10, wherein the first region of the workpiece has SiC and the second region of the workpiece has SiN or $SiO_2$.

12. The apparatus of claim 10, wherein, in (b), an oxygen-containing gas is supplied.

13. The apparatus of claim 12, wherein the oxygen-containing gas is $O_2$, CO, COS, or $CO_2$.

14. An apparatus for etching a workpiece including a first region and a second region different from the first region, the first region including SiC or SiN and the second region including a Si-containing material, the apparatus comprising:
a chamber;
a substrate support disposed in the chamber;
a gas inlet for introducing a process gas into the chamber;
a plasma generator configured to generate a plasma from the process gas in the chamber; and
a controller configured to cause:
(a) exposing the workpiece to a first plasma to form an etching assistance layer on the first region; and
(b) after (a), exposing the workpiece to a second plasma to remove the etching assistance layer from the first region by etching the first region at a first etch rate and the second region at a second region, the first etch rate being greater than the second etch rate.

15. An apparatus for etching a workpiece including a first region and a second region different from the first region, the first region including SiC or SiN and the second region including a Si-containing material, the apparatus comprising:
a chamber;
a substrate support disposed in the chamber;
a gas inlet for introducing a process gas into the chamber;
a plasma generator configured to generate a plasma from the process gas in the chamber; and
a controller configured to control an overall operation of the apparatus to execute a process comprising:
generating a first plasma in the chamber using a first process gas and forming an etching assistance layer on at least one of a surface of the first region and the second region; and
generating a second plasma from a second process gas in the processing chamber to etch the first region and the second region such that an etching rate in the first region becomes higher than an etching rate of the second region, thereby selectively removing the etching assistance layer of the first region while at least a portion of the etching assistance layer remains on the second region without being removed.

16. The apparatus of claim 15, wherein the process further comprising continuously performing the generating of the first plasma and the generating of the second plasma for a predetermined number of times while a vacuum state is maintained.

17. The apparatus of claim 15, wherein the first region of the workpiece has SiN and the second region of the workpiece has SiC.

* * * * *